United States Patent
Tai et al.

(10) Patent No.: US 9,972,526 B2
(45) Date of Patent: May 15, 2018

(54) METHOD FOR FORMING CONDUCTIVE STRUCTURE IN SEMICONDUCTOR STRUCTURE

(71) Applicant: Taiwan Semiconductor Manufacturing Co., Ltd., Hsinchu (TW)

(72) Inventors: Chia-Hsin Tai, Tainan (TW); Chih-Ching Cheng, Xizhou Township, Changhua County (TW); Fang-Yi Wu, Kaohsiung (TW); Yi-Wei Chiu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days. days.

(21) Appl. No.: 15/223,087

(22) Filed: Jul. 29, 2016

(65) Prior Publication Data

US 2018/0033686 A1    Feb. 1, 2018

(51) Int. Cl.
*H01L 21/768* (2006.01)
*H01L 23/528* (2006.01)
*H01L 23/522* (2006.01)

(52) U.S. Cl.
CPC .. *H01L 21/76816* (2013.01); *H01L 21/76877* (2013.01); *H01L 23/528* (2013.01); *H01L 23/5226* (2013.01)

(58) Field of Classification Search
None
See application file for complete search history.

(56) References Cited

U.S. PATENT DOCUMENTS

| 8,039,179 | B2 | 10/2011 | Shieh et al. |
| 8,202,681 | B2 | 6/2012 | Lin et al. |
| 8,728,332 | B2 | 5/2014 | Lin et al. |
| 8,822,343 | B2 | 9/2014 | Hsieh et al. |
| 2006/0091468 | A1 | 5/2006 | Liaw |
| 2010/0096719 | A1* | 4/2010 | Lee ............ H01L 21/0332 257/506 |
| 2011/0281208 | A1 | 11/2011 | Lin et al. |
| 2012/0278776 | A1 | 11/2012 | Lei et al. |
| 2013/0260563 | A1* | 10/2013 | Yang ............ H01L 21/0337 438/703 |
| 2013/0295769 | A1 | 11/2013 | Lin et al. |
| 2013/0320451 | A1 | 12/2013 | Liu et al. |

(Continued)

*Primary Examiner* — Seahvosh Nikmanesh
*Assistant Examiner* — Xiaoming Liu
(74) *Attorney, Agent, or Firm* — McClure, Qualey & Rodack, LLP

(57) ABSTRACT

A method for manufacturing a semiconductor structure is provided. The method includes forming a mask layer over a substrate, forming a material layer over the mask layer, forming a first blocking structure and a second blocking structure in the material layer separated from each other, and forming a first opening and a second opening in the material layer aligned with the first blocking structure. The method further includes forming a first spacer on sidewalls of the first opening and a second spacer on sidewalls of the second opening, forming a third opening and a fourth opening in the material layer aligned with the second blocking structure, etching the mask layer through the first opening, the second opening, the third opening, and the fourth opening.

20 Claims, 24 Drawing Sheets

(56) References Cited

U.S. PATENT DOCUMENTS

| | | |
|---|---|---|
| 2014/0193974 A1 | 7/2014 | Lee et al. |
| 2014/0215421 A1 | 7/2014 | Chen et al. |
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |
| 2016/0260616 A1* | 9/2016 | Li ..................... H01L 21/3065 |

* cited by examiner

METHOD FOR FORMING CONDUCTIVE STRUCTURE IN SEMICONDUCTOR STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Over the past several decades, the semiconductor integrated circuit industry has experienced rapid growth. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Although existing processes for manufacturing semiconductor structures have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A-2 to 1P-2 are cross-sectional representations of the semiconductor structure shown along line A-A' in FIGS. 1A-1 to 1P-1 in accordance with some embodiments.

FIGS. 1A-3 to 1P-3 are cross-sectional representations of the semiconductor structure shown along line B-B' in FIGS. 1A-1 to 1P-1 in accordance with some embodiments.

DETAILED DESCRIPTION

Figures 1, 1A:
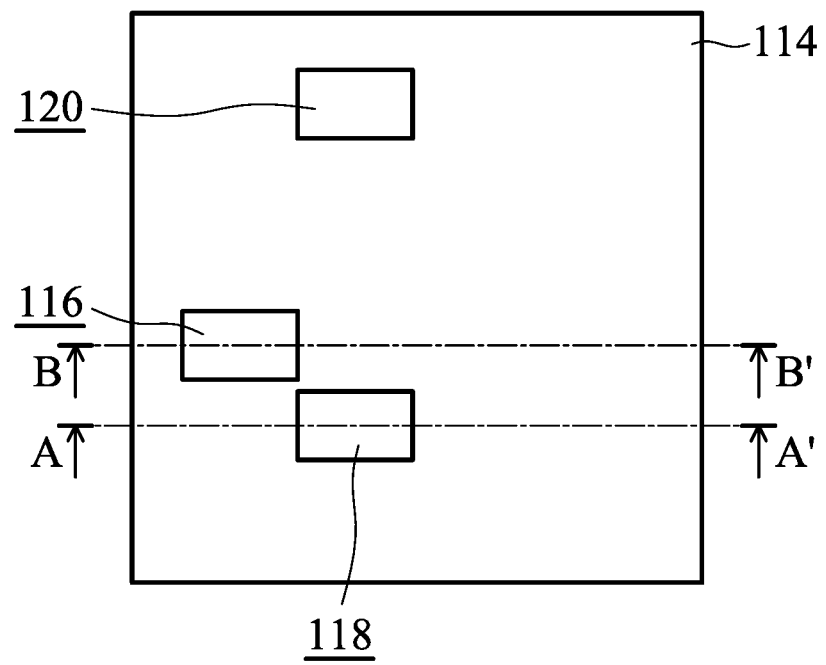
FIGS. 1A-1 to 1P-1 are top views of various stages of forming a semiconductor structure 100 in accordance with some embodiments.
Figures 1, 1A, 2:
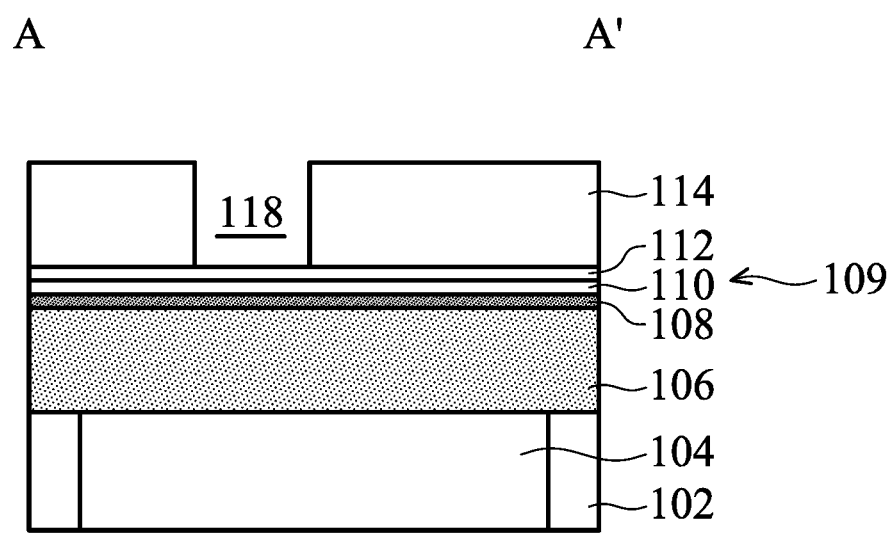
Figures 1, 1A, 2, 3:
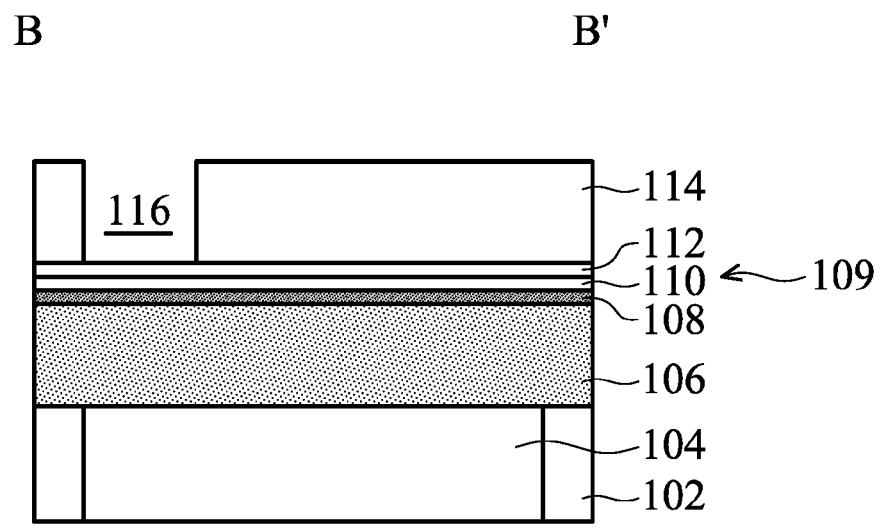
Figures 1, 1B:
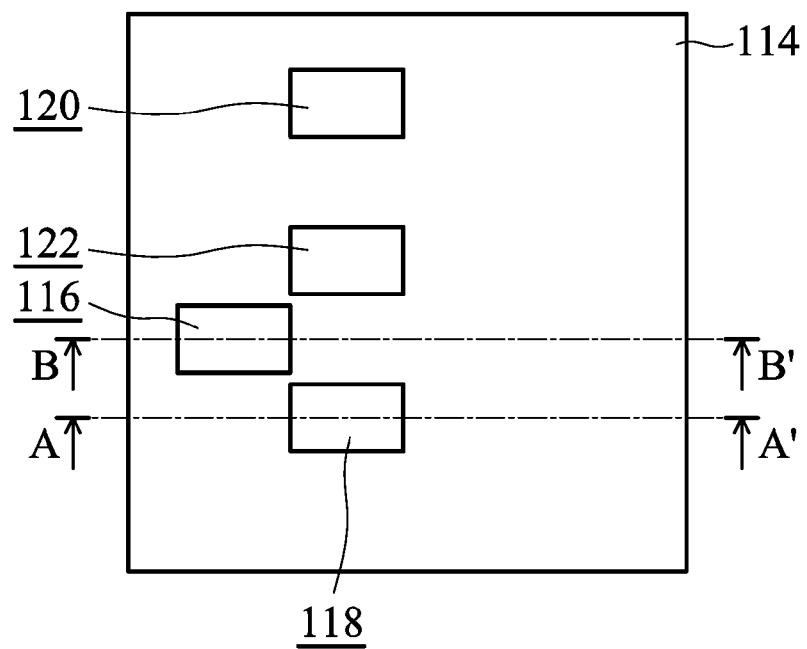
Figures 1, 1B, 2:
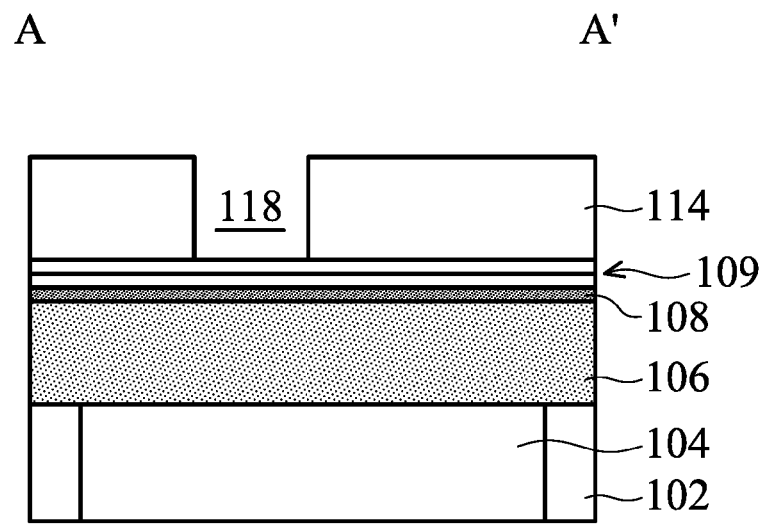
Figures 1, 1B, 2, 3:
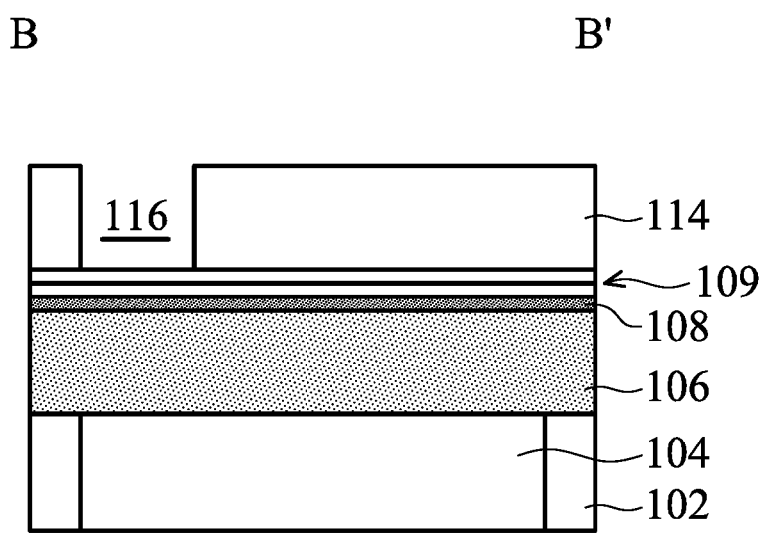
Figures 1, 1C:
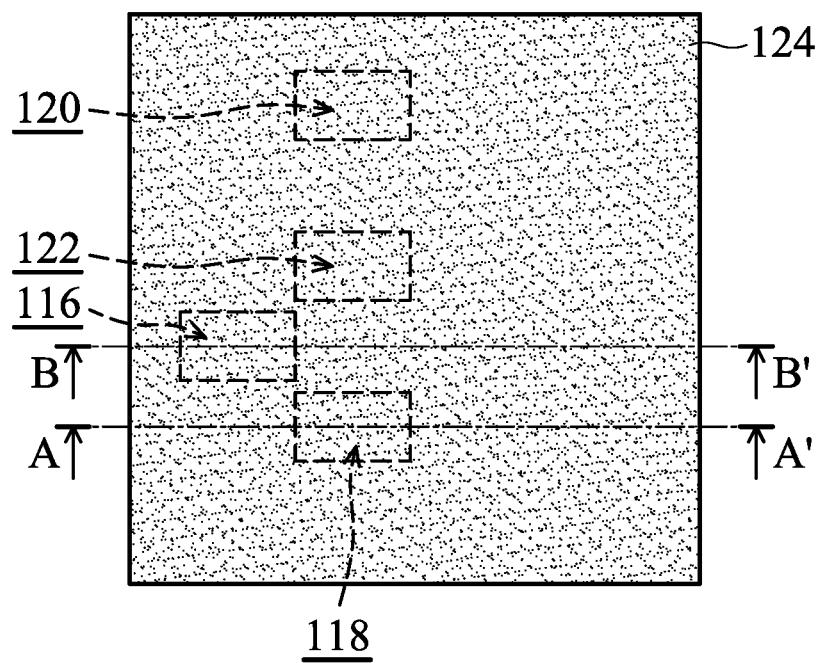
Figures 1, 1C, 2:
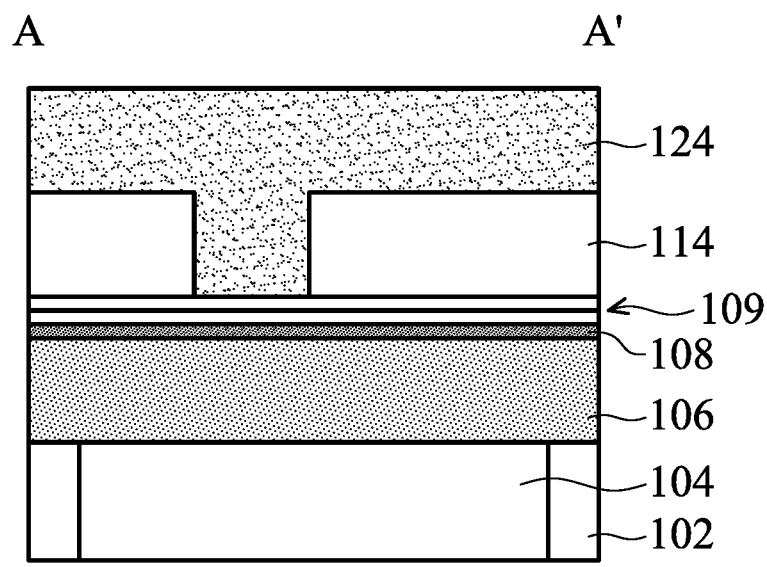
Figures 1, 1C, 2, 3:
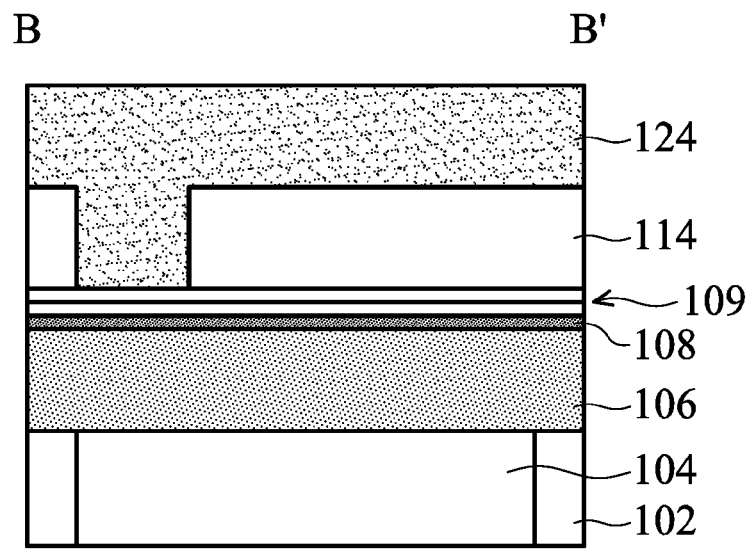

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments for forming semiconductor structures are provided. The semiconductor structure includes conductive structures formed in a dielectric layer. In addition, during the formation of the semiconductor structure, blocking structures are formed first and openings aligned with the blocking structures are formed afterwards, such that the openings can be divided into portions separated by the blocking structures and the conductive structure (e.g. metal lines) can be formed with the designed pattern.

Figures 1, 1D:
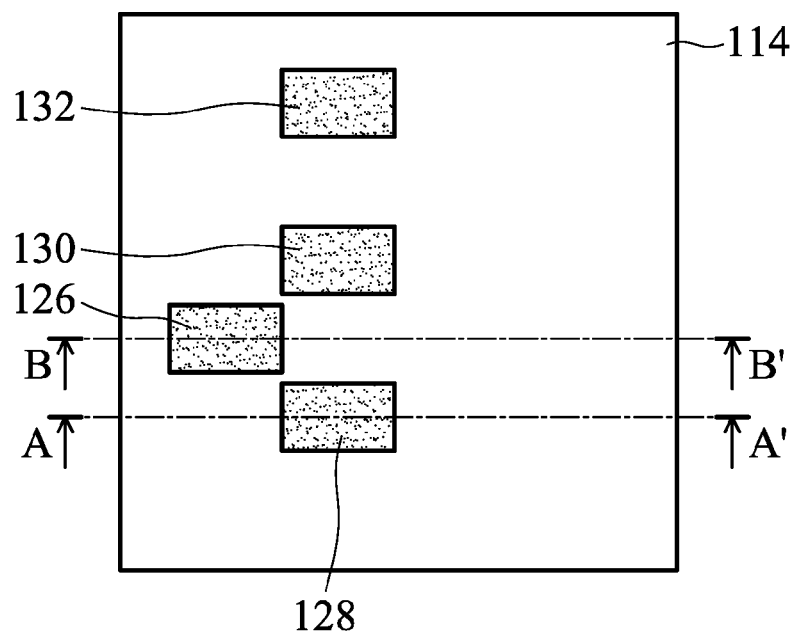
Figures 1, 1D, 2:
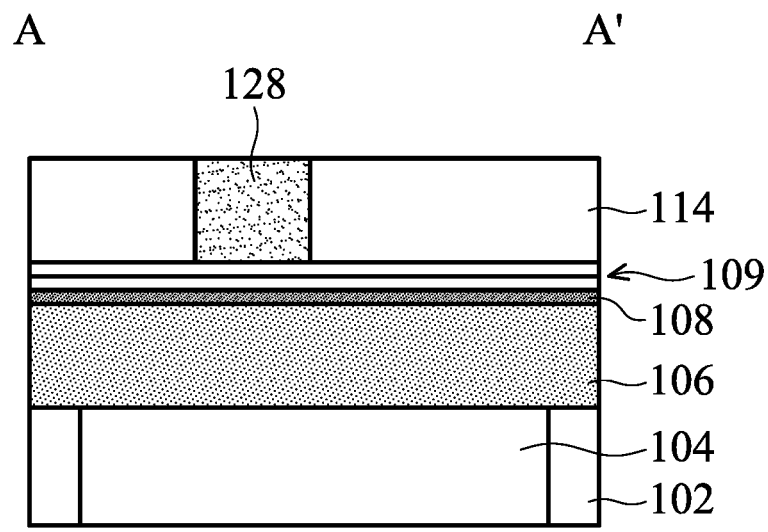
Figures 1, 1D, 2, 3:
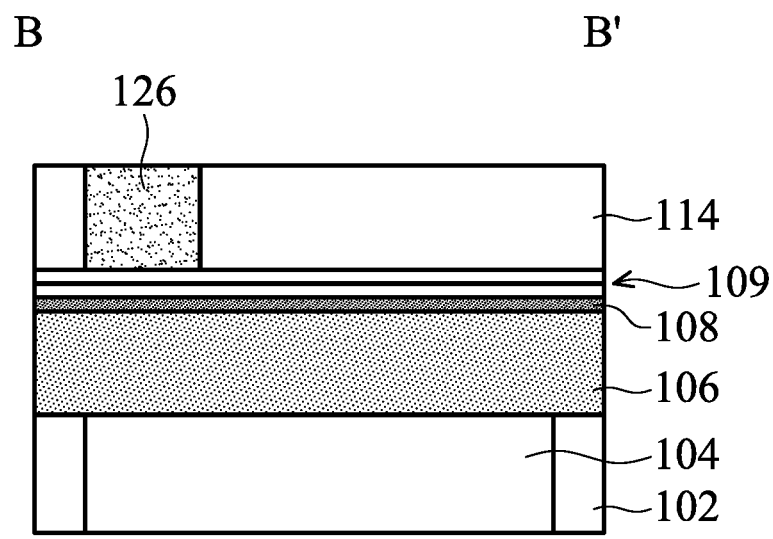
Figures 1, 1E:
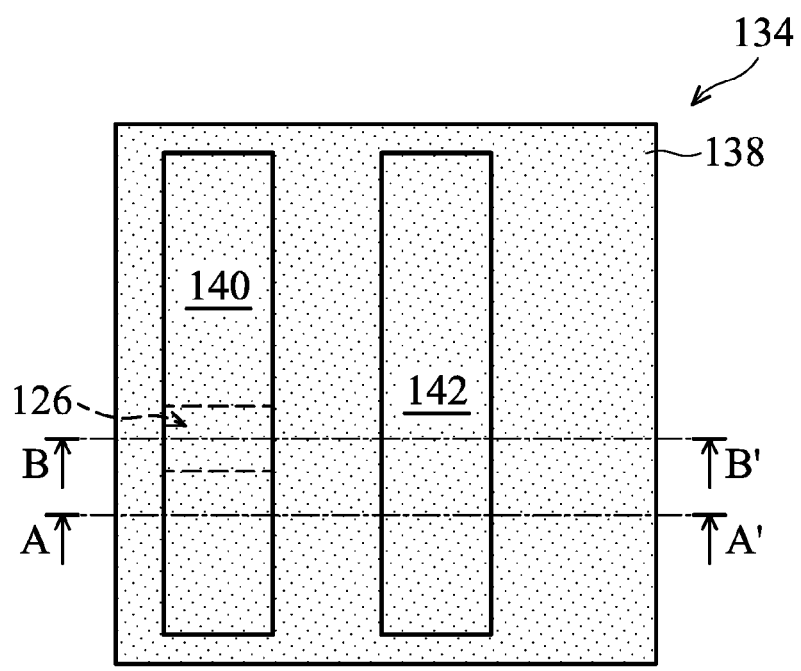
Figures 1, 1E, 2:
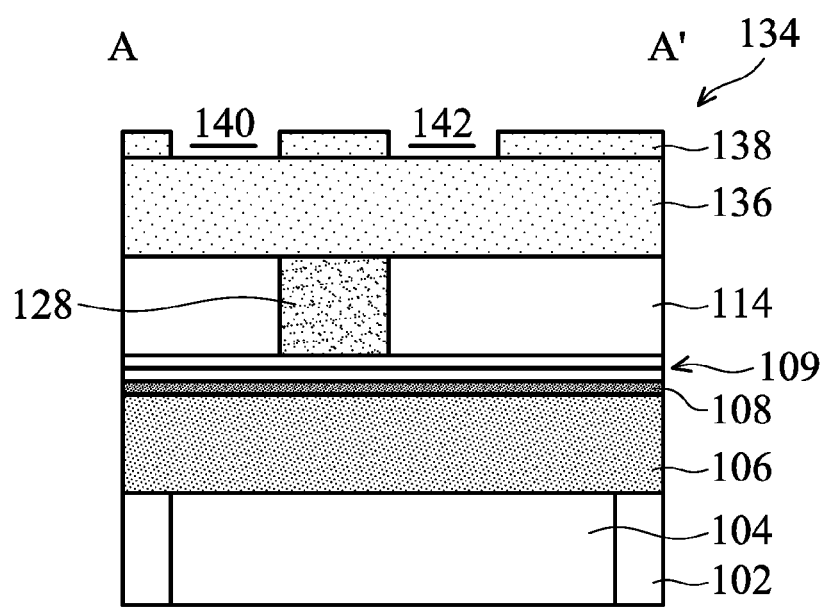
Figures 1, 1E, 2, 3:
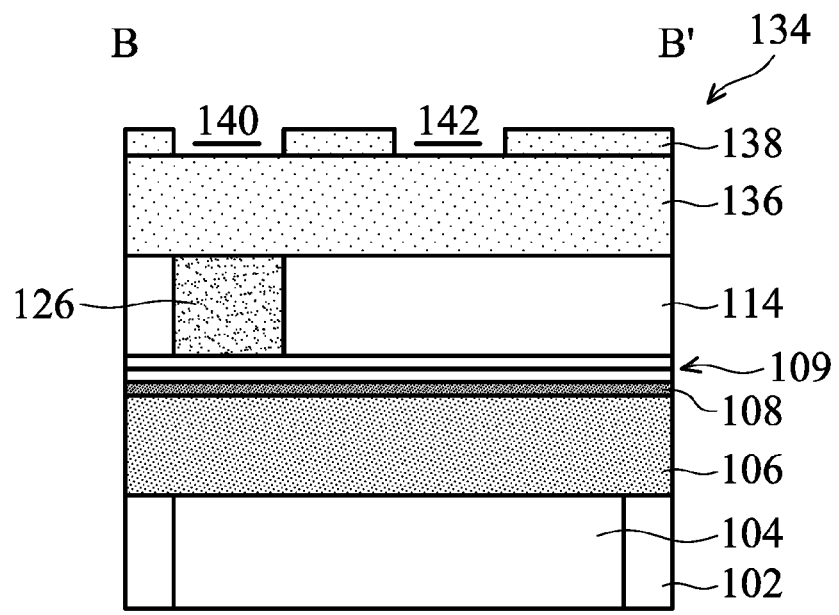
Figures 1, 1F:
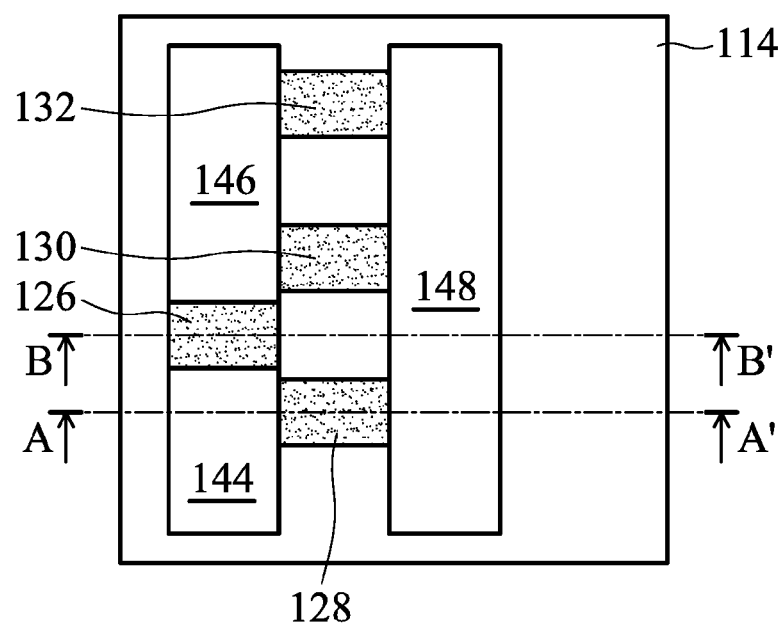
Figures 1, 1F, 2:
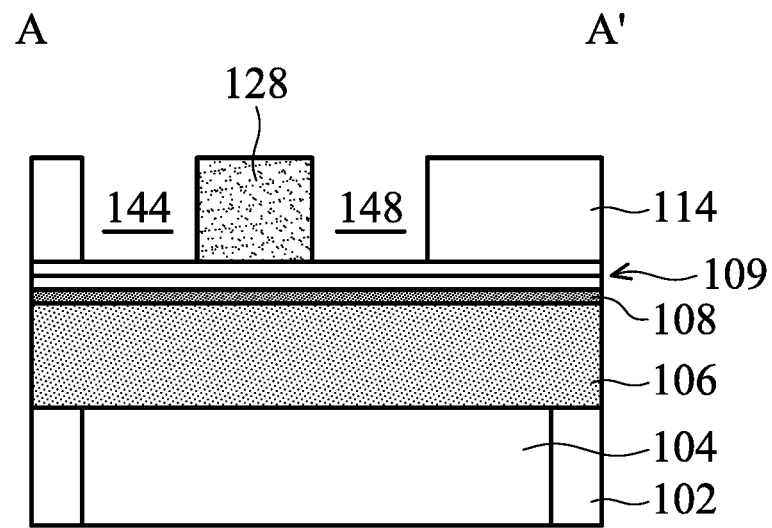
Figures 1, 1F, 2, 3:
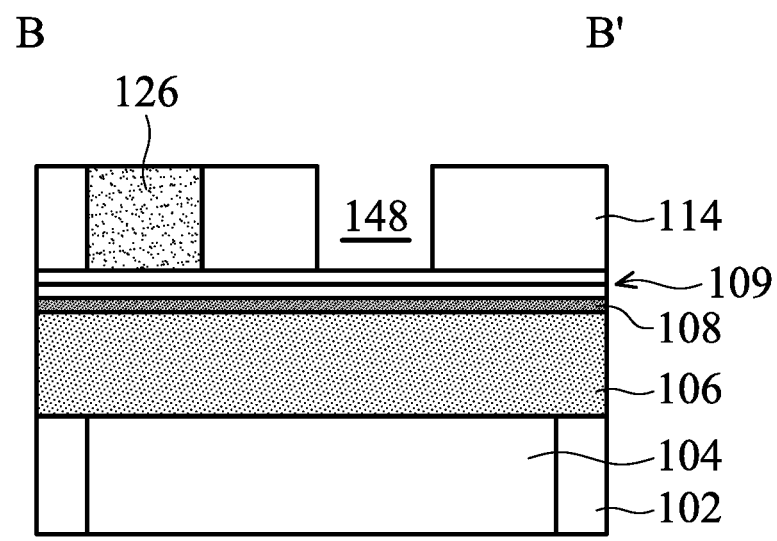
Figures 1, 1G:
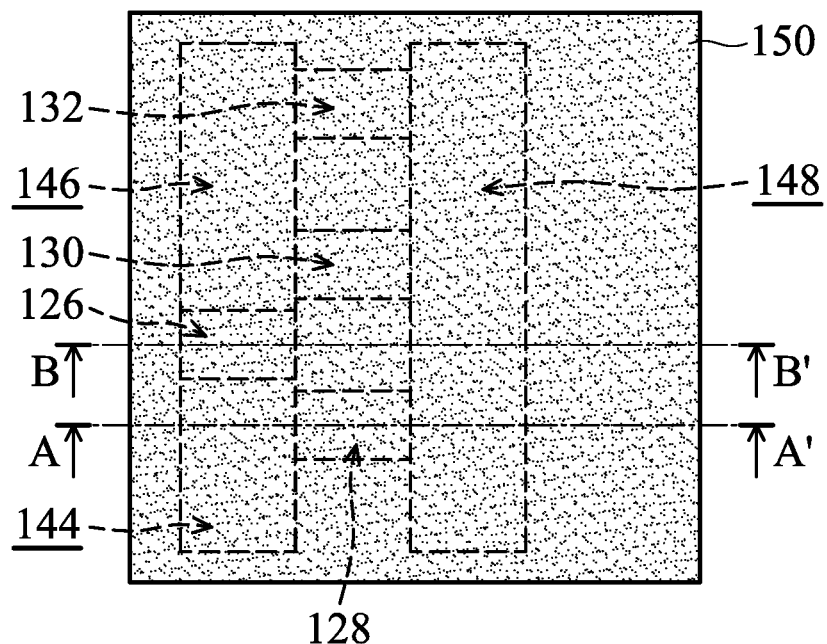
Figures 1, 1G, 2:
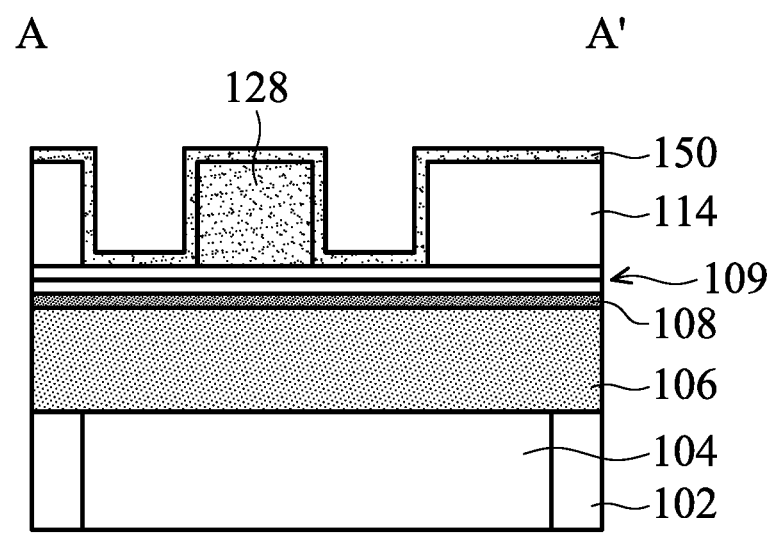
Figures 1, 1G, 2, 3:
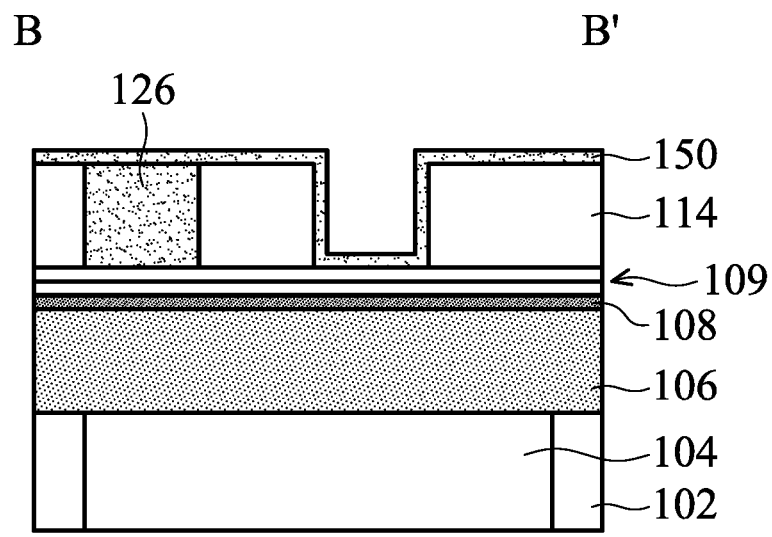
Figures 1, 1H:
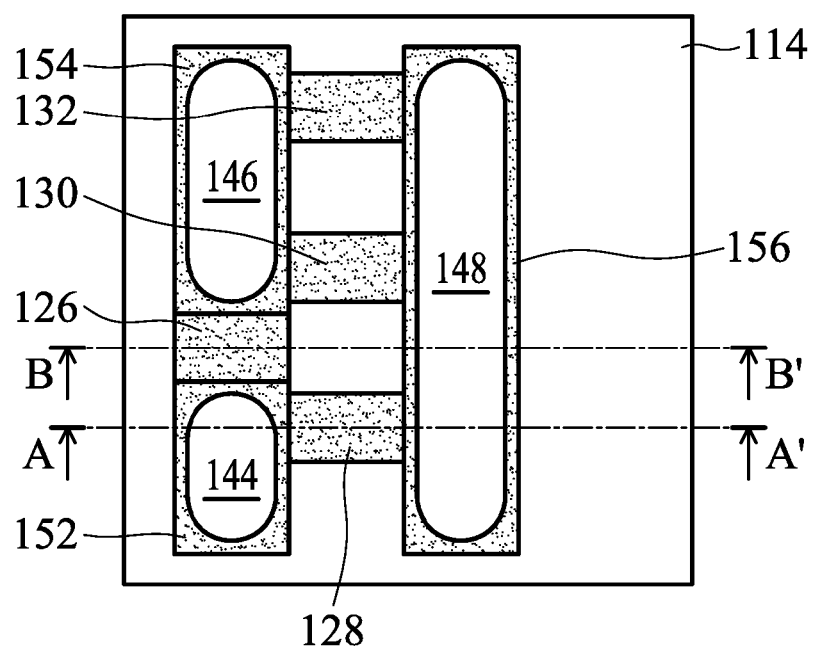
Figures 1, 1H, 2:
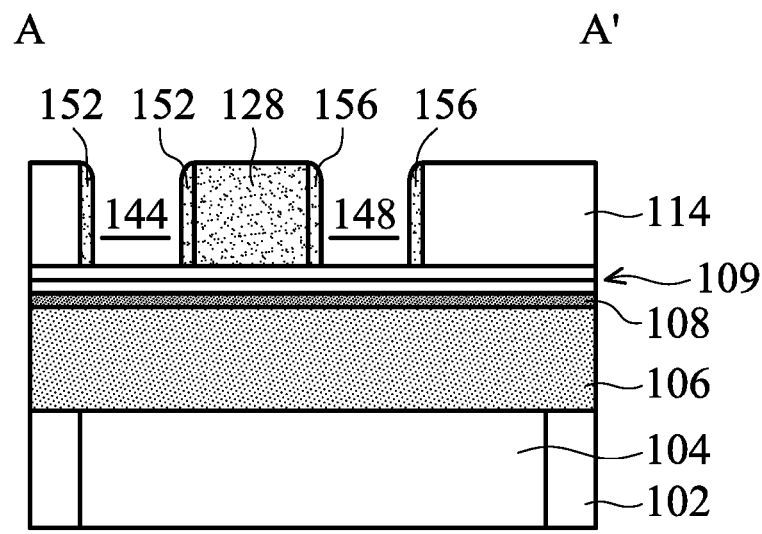
Figures 1, 1H, 2, 3:
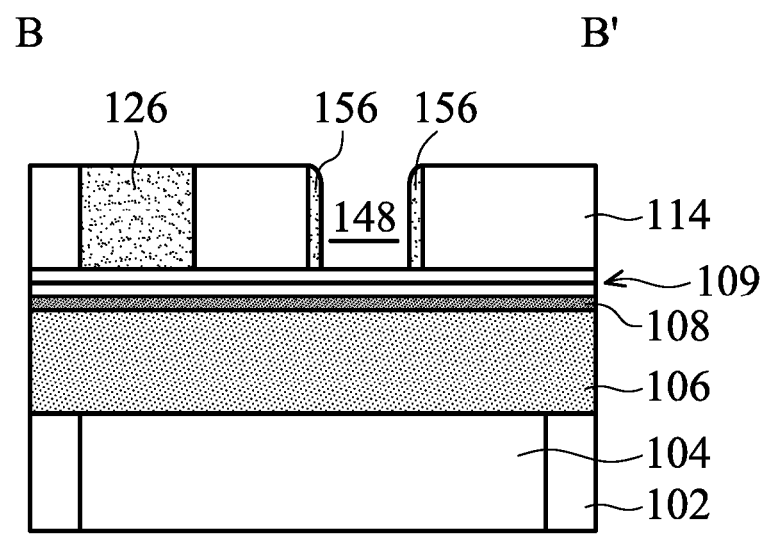
Figures 1, 1I:
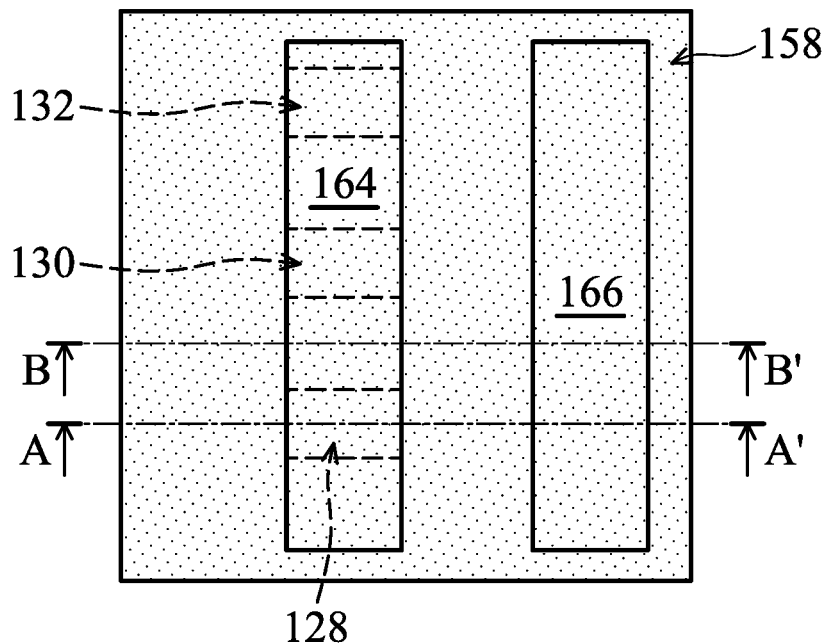
Figures 1, 1I, 2:
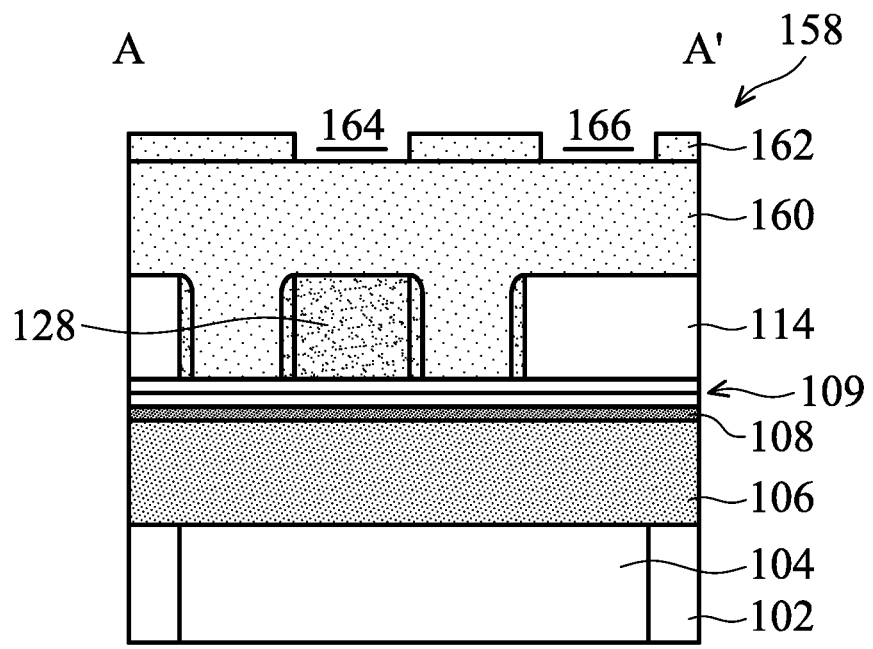
Figures 1, 1I, 2, 3:
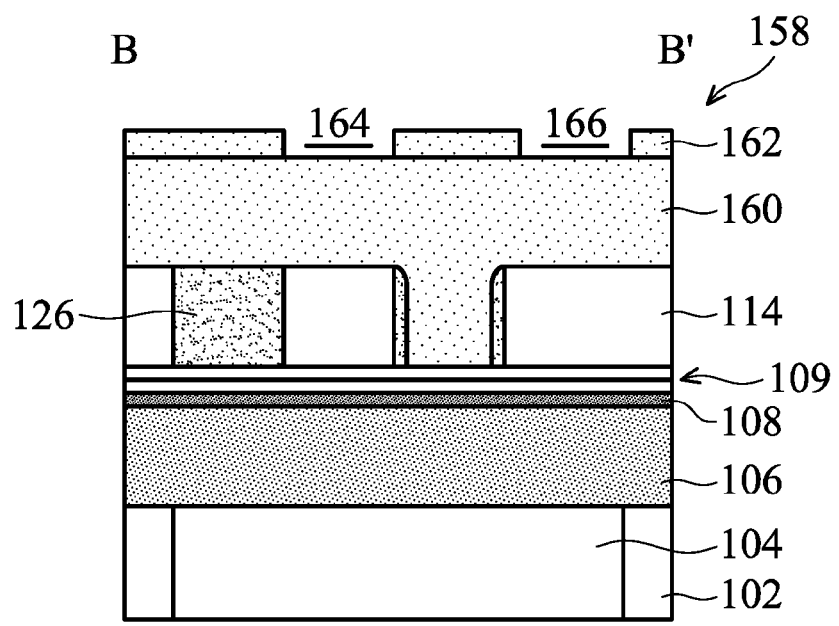
Figures 1, 1J:
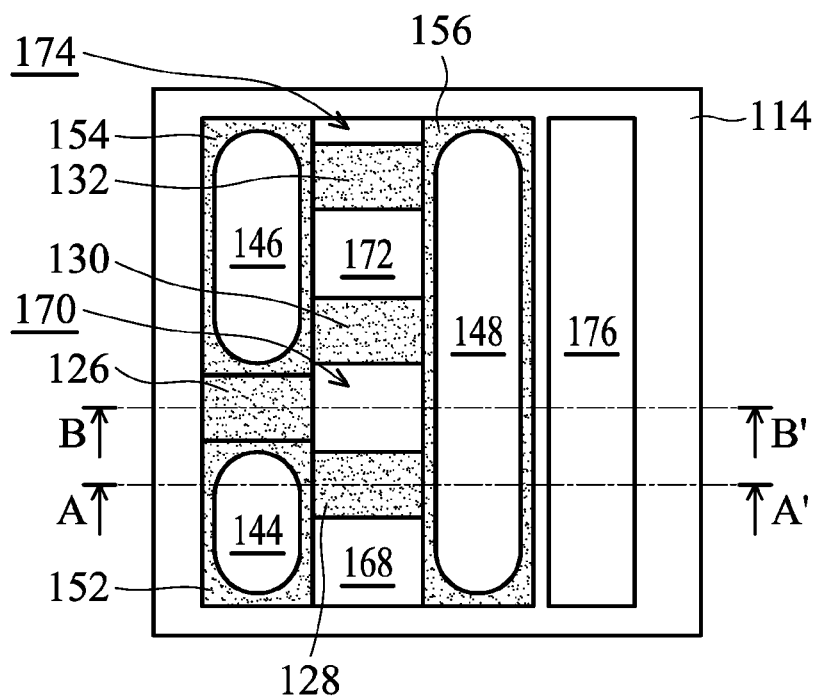
Figures 1, 1J, 2:
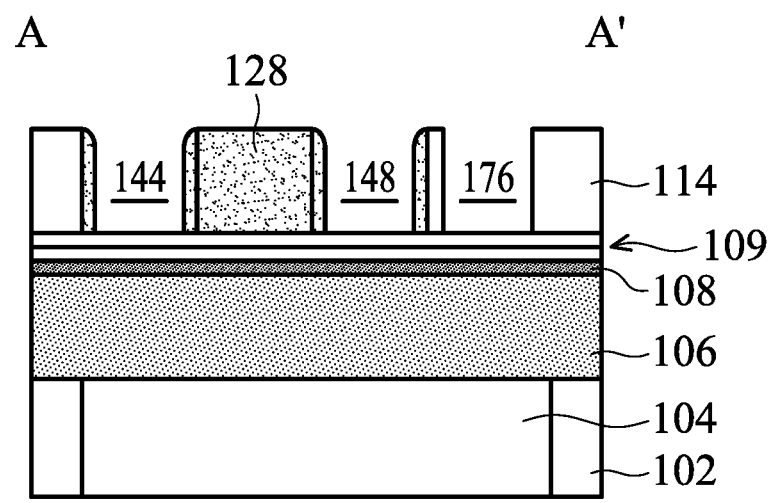
Figures 1, 1J, 2, 3:
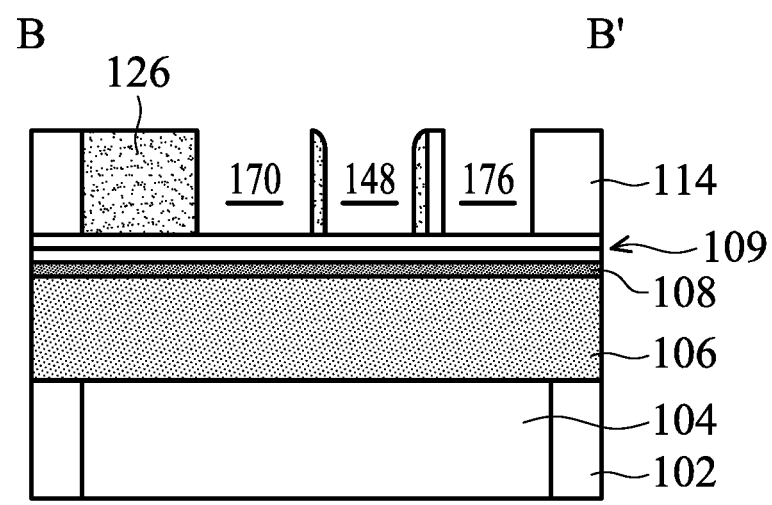
Figures 1, 1K:
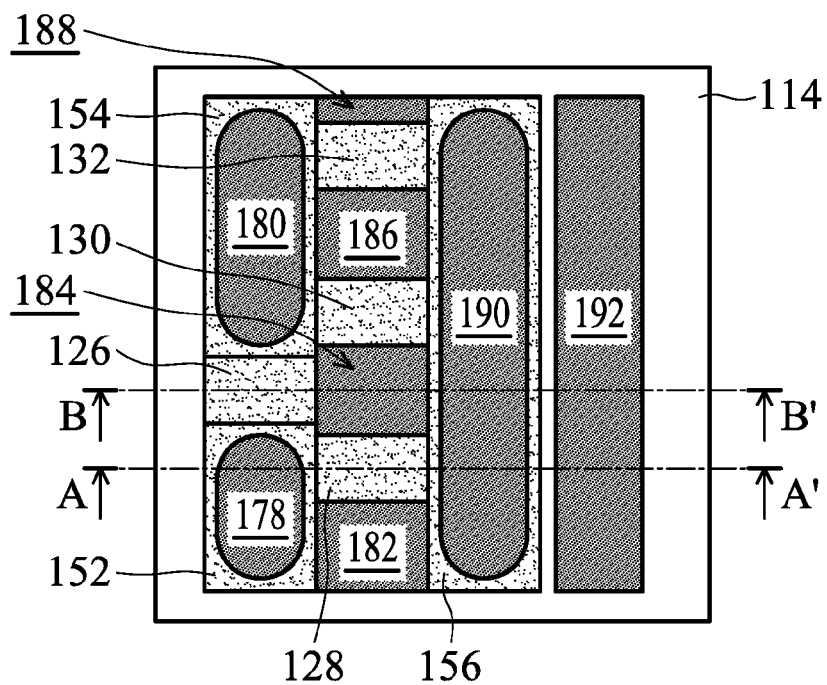
Figures 1, 1K, 2:
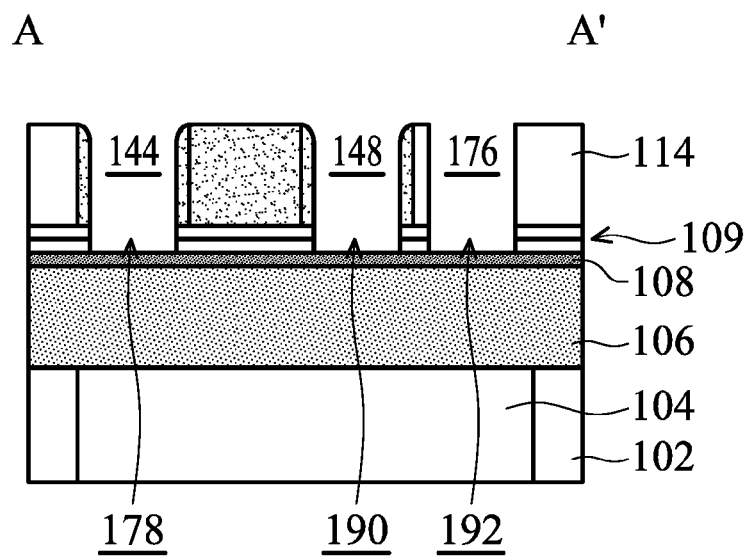
Figures 1, 1K, 2, 3:
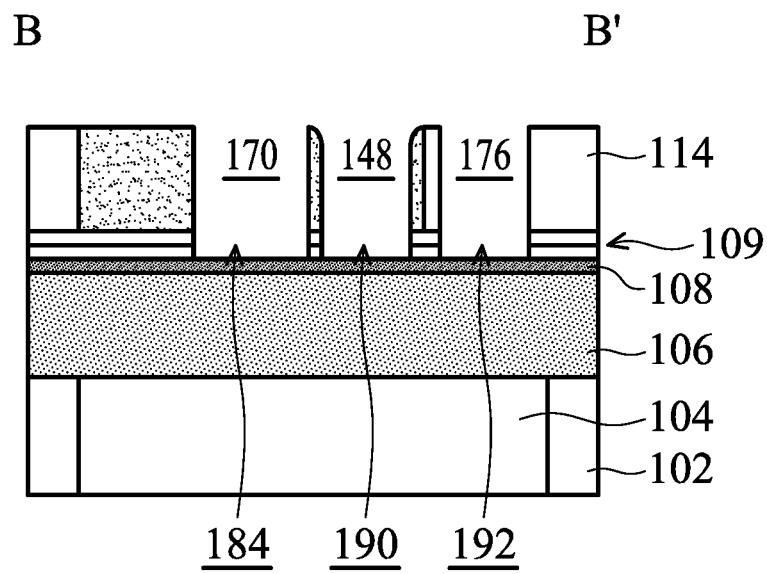
Figures 1, 1L:
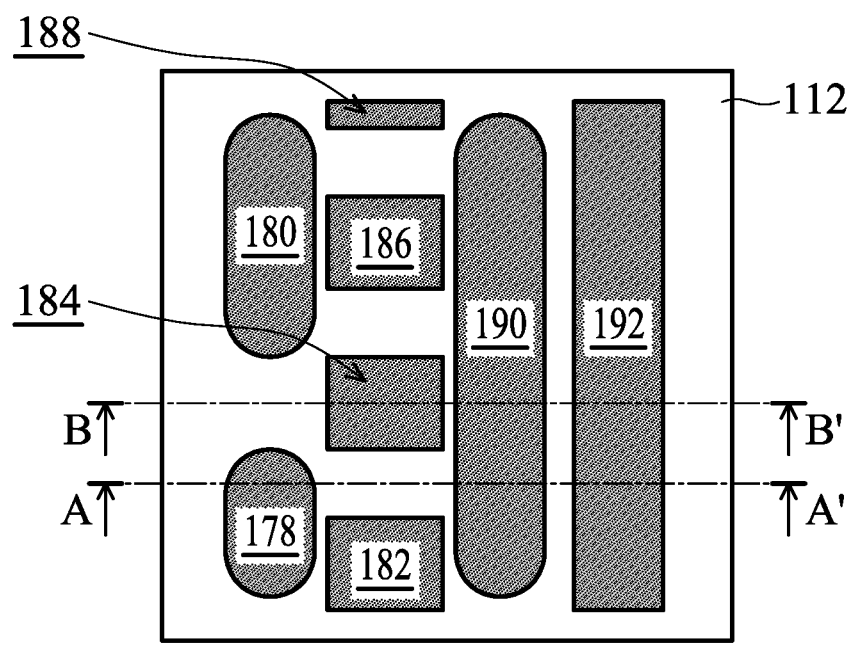
Figures 1, 1L, 2:
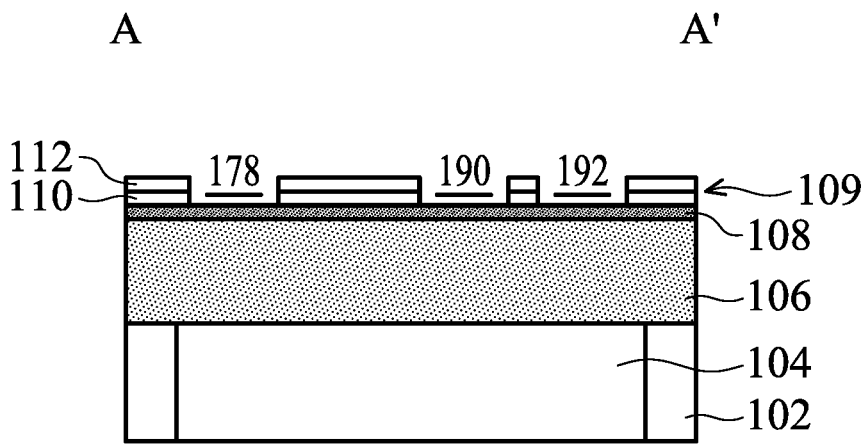
Figures 1, 1L, 2, 3:
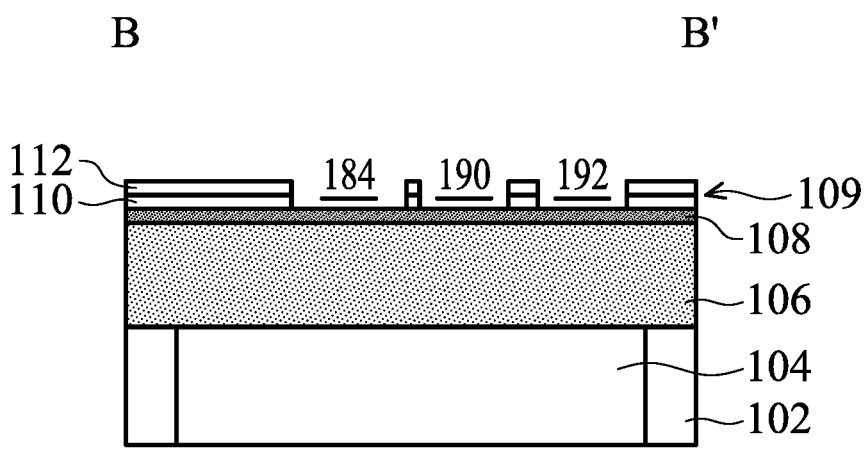
Figures 1, 1M:
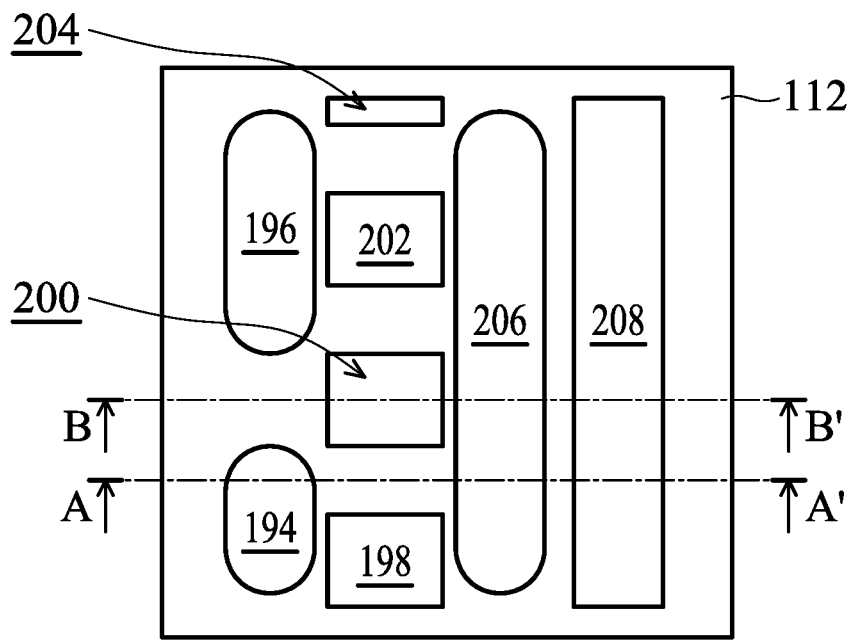
Figures 1, 1M, 2:
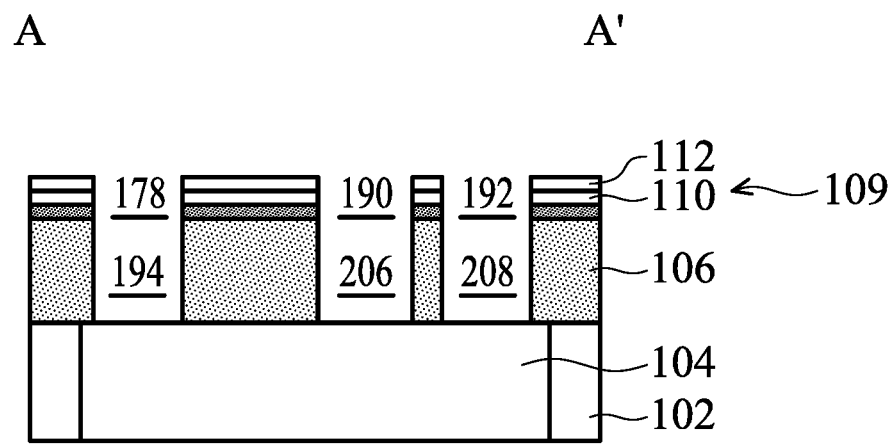
Figures 1, 1M, 2, 3:
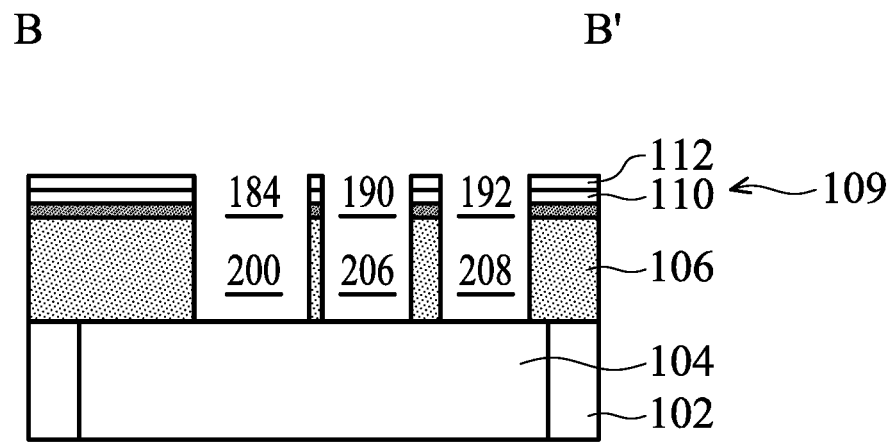
Figures 1, 1N:
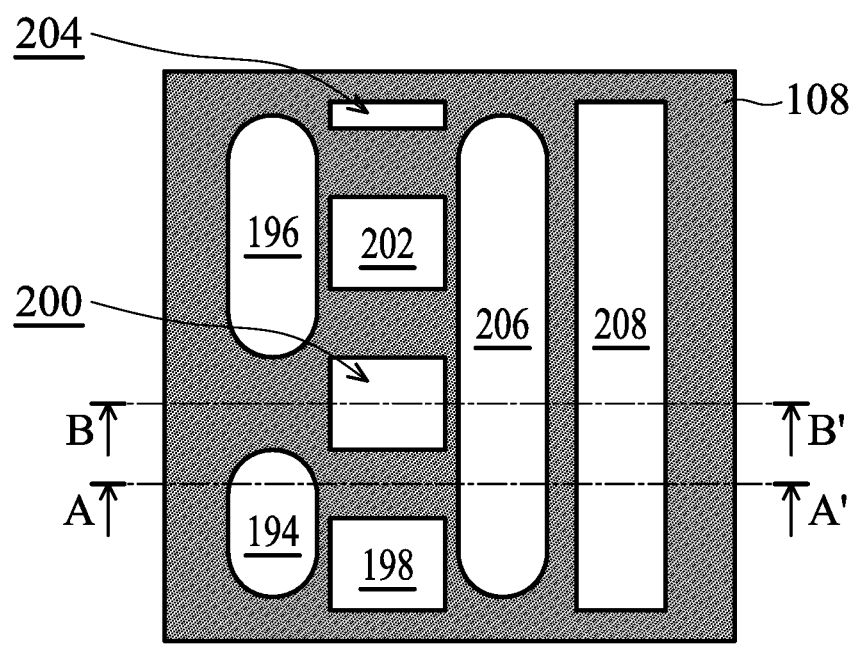
Figures 1, 1N, 2:
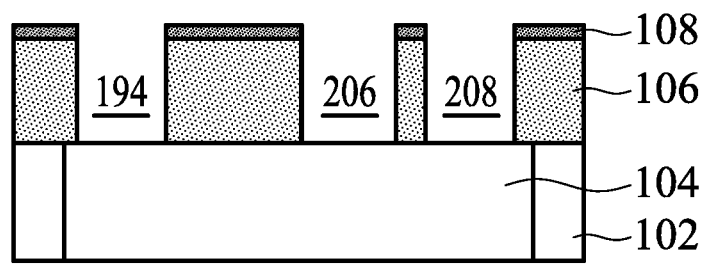
Figures 1, 1N, 2, 3:
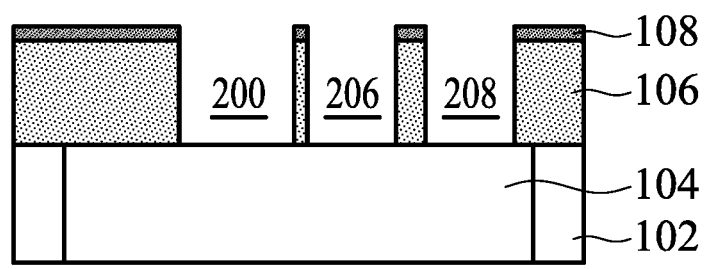
Figures 1, 1O:
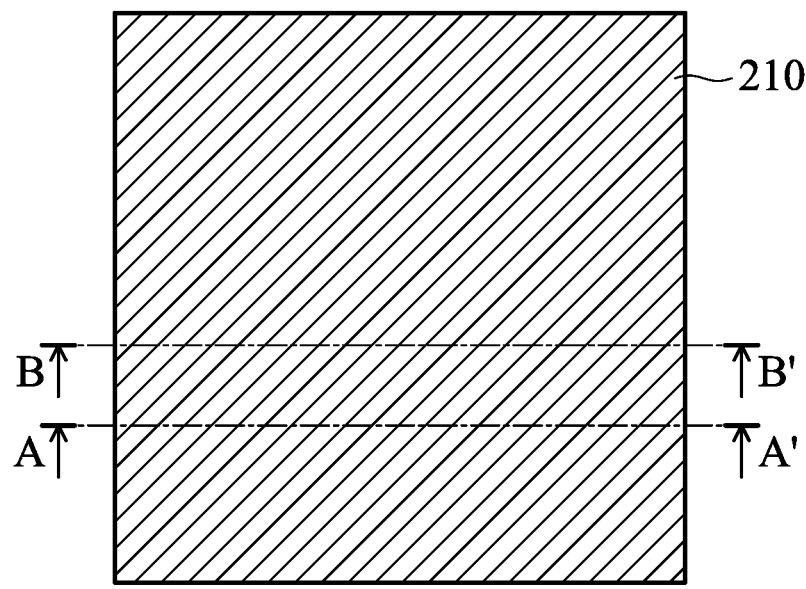
Figures 1, 1O, 2:
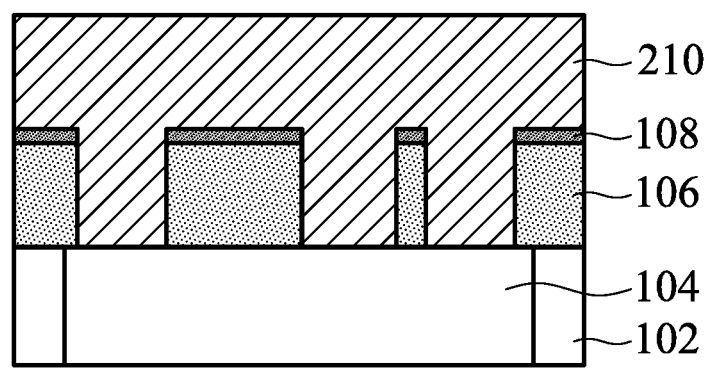
Figures 1, 1O, 2, 3:
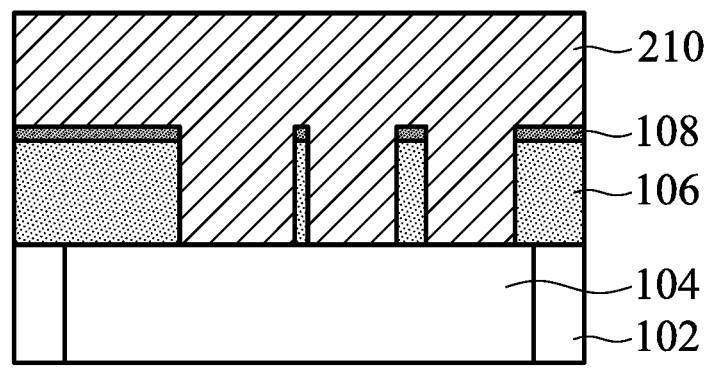
Figures 1, 1P:
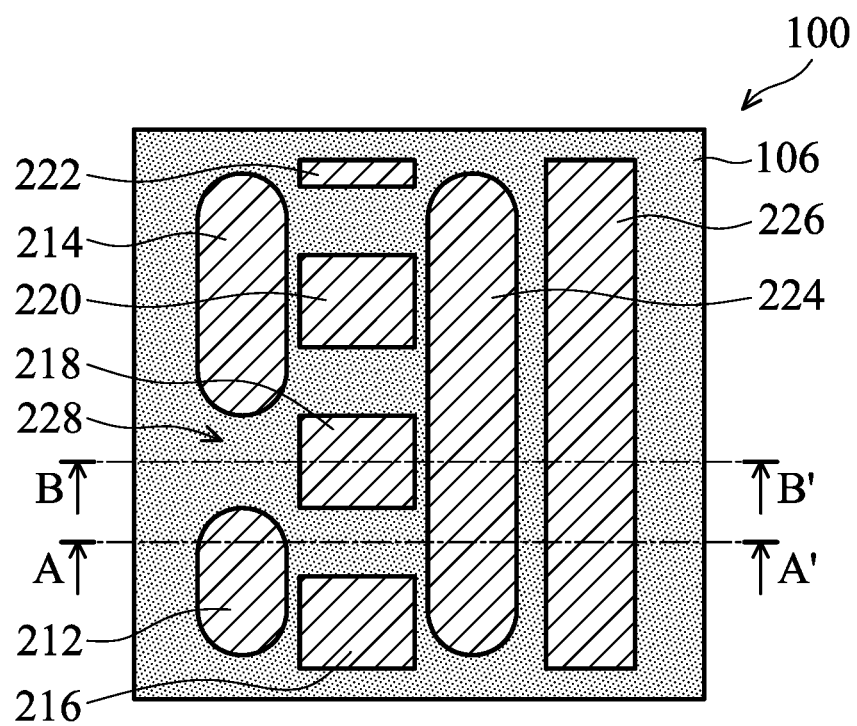
Figures 1, 1P, 2:
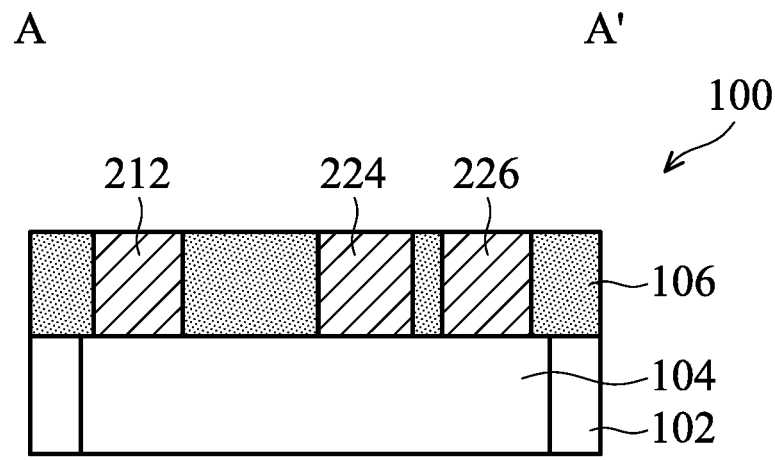
Figures 1, 1P, 2, 3:
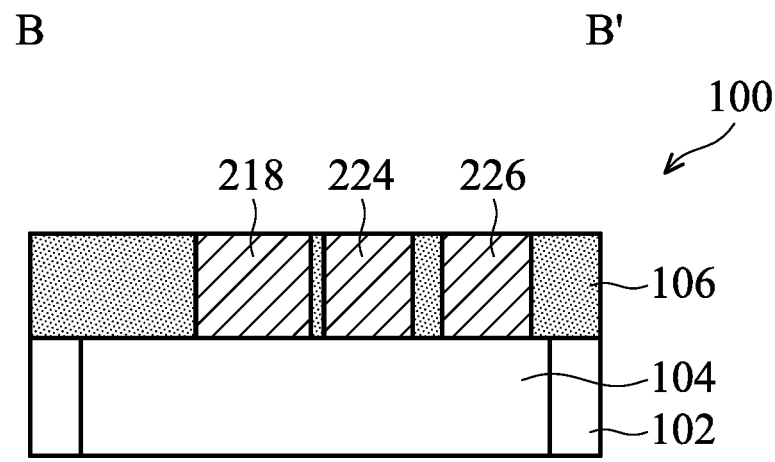

FIGS. 1A-1 to 1P-1 are top views of various stages of forming a semiconductor structure 100 in accordance with some embodiments. FIGS. 1A-2 to 1P-2 are cross-sectional representations of the semiconductor structure shown along line A-A' in FIGS. 1A-1 to 1P-1 in accordance with some embodiments. FIGS. 1A-3 to 1P-3 are cross-sectional representations of the semiconductor structure shown along line B-B' in FIGS. 1A-1 to 1P-1 in accordance with some embodiments.

As shown in FIGS. 1A-1 to 1A-3, a substrate 102 is received in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, the substrate 102 may include structures such as doped regions, interlayer dielectric (ILD) layers, conductive features, and/or isolation structures. Furthermore, the substrate 102 may further include single or multiple material layers to be patterned. For example, the material layers may include a silicon layer, a dielectric layer, and/or a doped poly-silicon layer.

In some embodiments, the substrate 102 includes a device region 104, as shown in FIG. 1A. The device region 104 may have various device elements. Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and/or other applicable processes.

A dielectric layer 106 is formed over the substrate 102, as shown in FIGS. 1A-1 to 1A-3 in accordance with some embodiments. In some embodiments, the dielectric layer 106 is an interlayer dielectric layer or an intermetal dielectric layer. The dielectric layer 106 may include multilayers made of multiple dielectric materials, such as a low dielectric constant or an extreme low dielectric constant (ELK) material. In some embodiments, the dielectric layer 106 is made of low-k dielectric materials. In some embodiments, the dielectric layer 106 is made of silicon oxide, silicon nitride, silicon oxynitride, phosphosilicate glass (PSG), borophosphosilicate glass (BPSG), and/or other applicable low-k dielectric materials. In some embodiments, the dielectric layer 106 is formed by performing a chemical vapor deposition (CVD) process, a physical vapor deposition (PVD) process, an atomic layer deposition (ALD) process, a spin-on coating process, or other applicable processes.

After the dielectric layer 106 is formed, an etch stop layer 108 is formed over the dielectric layer 106, and a mask layer 109 is formed over the etch stop layer 108 in accordance with some embodiments. The etch stop layer may also be used to protect the dielectric layer 106 from being damaged by the solvent (e.g. water) used in subsequent manufacturing processes. In some embodiments, the etch stop layer 108 is made of silicon nitride, silicon oxynitride, and/or other applicable materials. In some embodiments, the etch stop layer 108 is formed by performing a plasma enhanced chemical vapor deposition (CVD) process, a low pressure CVD process, an atomic layer deposition (ALD) process, or other applicable processes.

The mask layer 109 formed over the etch stop layer 108 may include a number of dielectric layers. In some embodiments, the mask layer 109 includes a nitride layer 110 formed over the etch stop layer 108 and an oxide layer 112 formed over the nitride layer 110. In some embodiments, the nitride layer 110 is made of silicon nitride, and the oxide layer 112 is made of silicon oxide. In some embodiments, the etch stop layer 108 and the mask layer 109 are made of different materials so that they can have etching selectivity during the patterning process performed afterwards.

After the mask layer 109 is formed, a material layer 114 is formed over the mask layer 109, as shown in FIGS. 1A-1 to 1A-3 in accordance with some embodiments. In some embodiments, the material layer 114 is a silicon layer. In some embodiments, the material layer 114 is an amorphous silicon layer. The amorphous silicon layer may be used to provide better etching selectivity toward the dielectric layer (e.g. the mask layer 109) formed below during the following patterning processes.

Next, openings are formed in the material layer 114. The opening may be formed separately or may be formed in the same patterning process. In some embodiments, the openings 116, 118, and 120 are formed first, and opening 122 is formed afterwards, as shown in FIGS. 1A-1 to 1B-2. In some embodiments, the openings 118, 120, 122 are aligned in a line while opening 116 is not aligned with them.

After the openings 116, 118, 120, and 122 are formed, a blocking material 124 is formed over the material layer 114 and the openings 116, 118, 120, and 122 are fully filled with the blocking material 124, as shown in FIGS. 1B-1 to 1B-3 in accordance with some embodiments. In some embodiments, the blocking material 124 is made of TiO.

Afterward, an etching process is performed to remove the blocking material 124 formed over the material layer 114 to form a first blocking structure 126, a second blocking structure 128, a third blocking structure 130, and a fourth blocking structure 132 in the material layer 114, as shown in FIGS. 1D-1 to 1D-3 in accordance with some embodiments. These blocking structures may be arranged according to the pattern of metal lines designed to be formed afterwards.

As shown in FIG. 1D-1, the second blocking structure, the third blocking structure 130, and the fourth blocking structure 132 are aligned in a line while the first blocking structure 126 is not aligned with them in accordance with some embodiments. That is, a number of the blocking structures which may be used to pattern different metal lines in subsequent processes are formed in the material layer 114 before the mask layer 109 is patterned.

After the first blocking structure 126, the second blocking structure 128, the third blocking structure 130, and the fourth blocking structure 132 are formed in the material layer 114, a photoresist structure 134 is formed over the material layer 114, as shown in FIGS. 1E-1 to 1E-3 in accordance with some embodiments. In some embodiments, the photoresist structure 134 includes a dielectric layer 136 and a resist layer 138, and the resist layer 138 has openings 140 and 142. In addition, a portion of the opening 140 is located over the first blocking structure 126, while the second blocking structure 128, the third blocking structure 130, and the fourth blocking structure 132 are not overlapped with opening 140 nor with opening 142, as shown in FIG. 1E-1 in accordance with some embodiments.

Next, the material layer 114 is patterned through the openings 140 and 142 of the photoresist structure 134 to form openings 144, 146, and 148 in the material layer 114, and the photoresist structure 134 is removed afterwards, as shown in FIGS. 1F-1 to 1F-3 in accordance with some embodiments.

More specifically, the material layer 114 is patterned by performing an etching process through the openings 140 and 142 of the photoresist structure 134 in accordance with some embodiments. As shown in FIG. 1F-1, the opening 148 is formed by etching the material layer 114 through the opening 142, and the openings 144 and 146 are formed by etching the material layer 114 through the opening 140. In addition, during the etching process, the first blocking structure 126 is used as a mask and is not removed during the etching process. Therefore, when the material layer 114 is etched through the opening 140, openings 144 and 146 are formed in the material layer at the opposite sides of the first blocking structure 126.

Next, a spacer layer 150 is conformally formed over the substrate 102 to cover the material layer 114, as shown in FIG. 1G-1 to 1G-3 in accordance with some embodiments. In addition, the spacer layer 150 is formed on the sidewalls and the bottom surfaces of the openings 144, 146, and 148. Furthermore, the spacer layer 150 is also formed over the top surfaces of the first blocking structure 126, the second blocking structure 128, the third blocking structure 130, and the fourth blocking structure 132.

In some embodiments, the spacer layer 150, the first blocking structure 126, the second blocking structure 128, the third blocking structure 130, and the fourth blocking structure 132 are made of the same material. In some embodiments, the spacer layer 150 is made of TiO.

After the spacer layer 150 is formed, an etching process is performed on the substrate 102 to form a spacer 152 on the sidewalls of the opening 144, a spacer 154 on the sidewalls of the opening 146, and a spacer 156 on the sidewalls of the opening 148, as shown in FIG. 1H-1 to 1H-3 in accordance with some embodiments.

As shown in FIG. 1H-1, after the spacers 152 and 154 are formed on the sidewalls of the openings 144 and 146, and the sidewalls of the openings 144 and 146 are rounded in accordance with some embodiments. In some embodiments, the opening 148 also has rounded sidewalls after the spacer 156 is formed.

In some embodiments, the spacer 154 is in contact with the first blocking structure 126 and the second blocking structure 128. In some embodiments, the spacer 154 is in contact with the first blocking structure 126, the third blocking structure 130, and the fourth blocking structure 132. In some embodiments, the spacer 156 is in contact with the second blocking structure 128, the third blocking structure 130, and the fourth blocking structure 132.

After the spacers 152, 154, and 156 are formed, a photoresist structure 158 is formed over the material layer 114, as shown in FIGS. 1I-1 to 1I-3 in accordance with some embodiments. In some embodiments, the photoresist structure 158 includes a dielectric layer 160 and a resist layer 162, and the resist layer 162 has openings 164 and 166. In addition, the opening 140 is located over and overlaps with the second blocking structure 128, the third blocking structure 130, and the fourth blocking structure 132, as shown in FIG. 1I-1 in accordance with some embodiments.

Next, the material layer 114 is patterned through the openings 164 and 166 of the photoresist structure 158 to form openings 144, 146, and 148 in the material layer 114, and the photoresist structure 158 is removed afterwards, as shown in FIGS. 1J-1 to 1J-3 in accordance with some embodiments.

More specifically, the material layer 114 is patterned by performing an etching process through the openings 164 and 166 of the photoresist structure 158 in accordance with some embodiments. As shown in FIG. 1J-1, the opening 176 is formed by etching the material layer 114 through the opening 166, and the openings 168, 170, and 172 are formed by etching the material layer 114 through the opening 164. In addition, during the etching process, the second blocking structure 128, the third blocking structure 130, and the fourth blocking structure 132 are used as masks and are not removed during the etching process. Therefore, when the material layer 114 is etched through the opening 164, openings 168, 170, and 172 are formed in the material layer that are aligned but separated from each other by the second blocking structure 128, the third blocking structure 130, and the fourth blocking structure 132. Accordingly, the openings 168, 170, and 172, the second blocking structure 128, the third blocking structure 130, and the fourth blocking structure 132 are aligned in a line, as shown in FIG. 1J-1.

As shown in FIG. 1J-1, openings 144, 146, 148, 168, 170, 172, 174, and 176 are all separated from one another in accordance with some embodiments. For example, the openings 144 and 146 are separated from the openings 168, 170, 172, and 174 by the spacers 152 and 154. In addition, the openings 168, 170, 172, and 174 are separated from the opening 148 by the spacer 156. These openings are well-defined and are used to pattern the dielectric layer 106 so that the conductive structure (e.g. metal line) can be formed precisely as designed.

Next, the mask layer 109 is etched through the openings 144, 146, 148, 168, 170, 172, 174, and 176 to form openings 178, 180, 182, 184, 186, 188, 190, and 192 in the mask layer 109 by performing an etching process, as shown in FIGS. 1K-1 to 1K-3 in accordance with some embodiments.

More specifically, the openings 178 and 180 are formed by etching through the openings 144 and 146 respectively, and therefore, the opening 178 and 180 also have rounded sidewalls, as shown in FIG. 1K-1 in accordance with some embodiments. In addition, the opening 190 is formed by etching through the opening 148, and therefore, the opening 190 also has rounded sidewalls.

In some embodiments, the etching process used to form the openings 178, 180, 182, 184, 186, 188, 190, and 192 in the mask layer 109 is a dry etching process. In some embodiments, the etching process is performed until the etch stop layer 108 is exposed.

After the openings 178, 180, 182, 184, 186, 188, 190, and 192 are formed, the material layer 114, the spacers 152, 154, and 156, the first blocking structure 126, the second blocking structure 128, the third blocking structure 130, and the fourth blocking structure 132 are removed, as shown in FIGS. 1L-1 to 1L-3 in accordance with some embodiments.

Next, the dielectric layer 106 is etched through the openings 178, 180, 182, 184, 186, 188, 190, and 192 to form trenches 194, 196, 198, 200, 202, 204, 206, and 208 in the dielectric layer 106, as shown in FIGS. 1M-1 to 1M-3 in accordance with some embodiments.

After the trenches 194, 196, 198, 200, 202, 204, 206, and 208 are formed in the dielectric layer, the mask layer 109 is removed, as shown in FIG. 1N-1 to 1N-3. Next, a conductive material 210 is formed over the dielectric layer 106, and the trenches 194, 196, 198, 200, 202, 204, 206, and 208 are filled with the conductive material 210, as shown in FIGS. 1O-1 to 1O-3 in accordance with some embodiments.

In some embodiments, the conductive material 210 is copper. In some embodiments, the conductive material 210 is aluminum, copper, tungsten, titanium, tantulum, titanium nitride, tantalum nitride, nickel silicide, cobalt silicide, TaC, TaSiN, TaCN, TiAl, TiAlN, or other applicable materials. In some embodiments, the conductive material 210 is formed by performing a spin-on coating process, a CVD process, a PVD process, or other applicable deposition or coating processes.

After the conductive material 210 is formed, a polishing process is performed to remove the conductive material 210 formed over the dielectric layer 106, as shown in FIGS. 1P-1 to 1P-3 in accordance with some embodiments. In some embodiments, the polishing process is a chemical mechanical polishing process. In some embodiments, the polishing process is performed until the top surface of dielectric layer 106 is exposed. After the polishing process is performed, conductive structures 212, 214, 216, 218, 220, 222, 224, and 226 formed in the dielectric layer 106 in accordance with some embodiments.

In some embodiments, the conductive structure (i.e. the conductive structures 212, 214, 216, 218, 220, 222, 224, and/or 226) has a smaller width at its bottom portion and has a greater width at its top portion. In some embodiments, the ratio of the width of the top surface to the width of the bottom surface of the conductive structure (i.e. the conductive structures 212, 214, 216, 218, 220, 222, 224, and/or 226) is in a range from about 1:0.77~0.87. In some embodiments, the ratio of the width of the top surface to the width of the middle portion of the conductive structure (i.e. the conductive structures 212, 214, 216, 218, 220, 222, 224, and/or 226) is in a range from about 1:0.88~0.93.

More specifically, the conductive structures 212 and 214 are aligned in a first line and are separated from each other by a blocking portion 228 of the dielectric layer 106. In addition, the conductive structures 212 and 214 are defined through the spacers 152 and 154 and therefore have rounded sidewalls in accordance with some embodiments. Therefore, the sidewalls of the blocking portion 228 located between the conductive structures 212 and 214 are rounded inwardly. That is, the middle portion of the blocking portion 228 is thinner than the outer portion of the blocking portion 228, such the distance between the conductive structures 212 and 214 is smaller at the middle portion and is greater at the outer portion. Similarly, the conductive structure 224, which is defined by the spacer 156, may also have rounded sidewalls.

Moreover, the conductive structures 216, 218, 220, and 222 are aligned in a second line next to the first line, while the conductive structures 216, 218, 220, and 222 are separated from each other. In addition, the conductive structures 216, 218, 220, 222, and 226 are not defined by the spacers and therefore may have flat sidewalls.

As shown in FIG. 1P-1, the conductive structures 212 and 214 may be seen as a first metal line in the semiconductor structure 100, as the blocking portion 228 separates the first metal line into two portions: the conductive structures 212 and 214. In addition, the conductive structures 216, 218, 220, and 222 may be seen as a second metal line formed next to and substantially parallel to the first metal line, as the second metal line is divided into four portions: the conductive structures 216, 218, 220, and 222. The conductive structures 224 and 226 may respectively be seen as a third metal line and a fourth metal line and are substantially parallel to the first metal line and the second metal line. In some embodiments, the conductive structures 212, 214, 216, 218, 220, 222, 224, and 226 formed in the dielectric layer 106 are used as a part of an interconnect structure to connect the electric units in the semiconductor structure 100.

It should be noted that the pattern of the conductive structures 212, 214, 216, 218, 220, 222, 224, and 226 formed in the dielectric layer 106 are merely a possible example of the arrangement of the interconnect structure formed in the semiconductor structure 100. That is, the semiconductor structure may additionally and/or optionally include other conductive structures in various dielectric layers. In addition, the shapes, sizes, and materials of the conductive structures may be adjusted depending on their applications, and the scope of the disclosure is not intended to be limiting.

As described above, the conductive structures 212 and 214 are formed by forming the first blocking structure 126 in the material layer 114 first, and therefore the resulting the conductive structures 212 and 214 can be precisely aligned while being well separated from each other. Similarly, the conductive structures 216, 218, 220, and 222 are formed by forming the second blocking structure 128, the third blocking structure 130, and the fourth blocking structure 132 in the material layer 114 first, and therefore the resulting conductive structure 216, 218, 220, and 222 can be precisely aligned while well separated from each other.

In addition, since the first blocking structure 126, the second blocking structure 128, the third blocking structure 130, and the fourth blocking structure 132 are formed in the material layer 114 first, following by forming the openings 144, 146, and 148, the spacers 152, 154, and 156, and the openings 168, 170, 172, 174, and 176 sequentially, the pattern in the mask layer 109 can be well defined with a relatively large process window and a greater alignment tolerance. Therefore, the metal lines formed accordingly may have a better performance, and the risk of a short circuit is reduced.

Embodiments of methods for forming a semiconductor structure are provided. The method may include forming a dielectric layer, a mask layer, and a material layer over a substrate sequentially. Next, a number of blocking structures are formed in the material layer first and openings are formed in the material layer afterwards. In addition, the openings are aligned with the blocking structures to form a designed pattern with a number of portions aligned but separated from each other. The mask layer is then patterned through the openings formed in the material layer and the dielectric layer is patterned according to the pattern in the mask layer to form conductive structure in the dielectric layer. The resulting conductive structures may be well aligned and separated as designed and the risk of a short circuit is reduced.

In some embodiments, a method for manufacturing a semiconductor structure is provided. The method for manufacturing a semiconductor structure includes forming a mask layer over a substrate and forming a material layer over the mask layer. The method for manufacturing a semiconductor structure further includes forming a first blocking structure and a second blocking structure in the material layer separated from each other and forming a first opening and a second opening in the material layer aligned with the first blocking structure. The method for manufacturing a semiconductor structure further includes forming a first spacer on sidewalls of the first opening and a second spacer on sidewalls of the second opening and forming a third opening and a fourth opening in the material layer aligned with the second blocking structure. The method for manufacturing a semiconductor structure further includes etching the mask layer through the first opening, the second opening, the third opening, and the fourth opening. In addition, the first opening and the third opening are separated by the first spacer, and the second opening and the fourth opening are separated by the second spacer.

In some embodiments, a method for manufacturing a semiconductor structure is provided. The method for manufacturing a semiconductor structure includes forming a mask layer over a dielectric layer over a substrate and forming a material layer over the mask layer. The method for manufacturing a semiconductor structure further includes forming a first blocking structure and a second blocking structure in the material layer separated from each other and forming a first opening and a second opening in the material layer at opposite sides of the first blocking structure. The method for manufacturing a semiconductor structure further includes forming a first spacer on sidewalls of the first opening and a second spacer on sidewalls of the second opening and forming a third opening and a fourth opening in the material layer at opposite sides of the second blocking structure. The method for manufacturing a semiconductor structure further includes patterning the mask layer and the dielectric layer according to a pattern of the first opening, the second opening, the third opening, and the fourth opening and forming a first conductive structure, a second conductive structure, a third conductive structure, and a fourth conductive structure in the dielectric layer having the pattern of the first opening, the second opening, the third opening, and the fourth opening.

In some embodiments, a method for manufacturing a semiconductor structure is provided. The method for manufacturing a semiconductor structure includes forming a mask layer over dielectric layer over a substrate and forming a material layer over the mask layer. The method for manufacturing a semiconductor structure further includes forming a first blocking structure, a second blocking structure, and a third blocking structure in the material layer separated from one another and forming a first opening and a second opening in the material layer aligned with the first blocking structure. The method for manufacturing a semiconductor structure further includes forming a first spacer on sidewalls of the first opening and a second spacer on sidewalls of the second opening and forming a third opening, a fourth opening, and a fifth opening in the material layer aligned with the second blocking structure and the third blocking structure. The method for manufacturing a semiconductor structure further includes patterning the mask layer and the dielectric layer according to a pattern of the first opening, the second opening, the third opening, the fourth opening, and the fifth opening and forming a first conductive structure, a second conductive structure, a third conductive structure, a fourth conductive structure, and a fifth conductive structure in the dielectric layer having the pattern of the first opening, the second opening, the third opening, the fourth opening, and the fifth opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
    forming a mask layer over a substrate;
    forming a material layer over the mask layer;
    forming a first blocking structure and a second blocking structure in the material layer isolated from each other;
    forming a first opening and a second opening in the material layer aligned with the first blocking structure;
    forming a first spacer on sidewalls of the first opening and a second spacer on sidewalls of the second opening;
    forming a third opening and a fourth opening in the material layer-aligned with the second blocking structure; and
    etching the mask layer through the first opening, the second opening, the third opening, and the fourth opening,
    wherein the first opening and the third opening are separated by the first spacer, and the second opening and the fourth opening are separated by the second spacer.

2. The method for manufacturing a semiconductor structure as claimed in claim 1, wherein the first spacer is in contact with the second blocking structure.

3. The method for manufacturing a semiconductor structure as claimed in claim 1, further comprising:
    forming a dielectric layer over the substrate before the mask layer is formed; and
    patterning the dielectric layer according to a pattern of the mask layer to form a first metal line and a second metal line in the dielectric layer,
    wherein the first metal line comprises a first conductive structure and a second conductive structure aligned but separated from each other, and the second metal line comprises a third conductive structure and a fourth conductive structure aligned but separate from each other.

4. The method for manufacturing a semiconductor structure as claimed in claim 1, wherein a fifth opening, a sixth opening, a seventh opening, and an eight opening are formed in the mask layer, and the fifth opening and sixth opening are aligned in a first line and the seventh opening and the eight opening are aligned in a second line substantially parallel with the first line.

5. The method for manufacturing a semiconductor structure as claimed in claim 4, further comprising:
    forming a dielectric layer over the substrate before the mask layer is formed;
    removing the material layer, the first blocking structure, the second blocking structure, the first spacer, and the second spacer;
    etching the dielectric layer through the fifth opening, the sixth opening, the seventh opening, and the eight opening to form a first trench, a second trench, a third trench, and a fourth trench in the dielectric layer; and
    forming a first conductive structure, a second conductive structure, a third conductive structure, and a fourth conductive structure in the first trench, the second trench, the third trench, and the fourth trench.

6. The method for manufacturing a semiconductor structure as claimed in claim 5, wherein the first conductive structure and the second conductive structure are separated by a blocking portion of the dielectric layer, and a sidewall of the blocking portion of the dielectric layer is rounded inwardly.

7. The method for manufacturing a semiconductor structure as claimed in claim 1, wherein the material layer is made of amorphous silicon.

8. The method for manufacturing a semiconductor structure as claimed in claim 1, wherein the first blocking structure and the second blocking structure are made of TiO.

9. A method for forming a semiconductor structure, comprising:
    forming a mask layer over a dielectric layer over a substrate;
    forming a material layer over the mask layer;
    forming a first blocking structure and a second blocking structure in the material layer separated by the material layer, wherein a first interface exists between the first blocking structure and the material layer and a second interface exists between the second blocking structure and the material layer;
    forming a first opening and a second opening in the material layer at opposite sides of the first blocking structure;
    forming a first spacer on sidewalls of the first opening and a second spacer on sidewalls of the second opening;
    forming a third opening and a fourth opening in the material layer at opposite sides of the second blocking structure;
    patterning the mask layer and the dielectric layer according to a pattern of the first opening, the second opening, the third opening, and the fourth opening; and
    forming a first conductive structure, a second conductive structure, a third conductive structure, and a fourth conductive structure in the dielectric layer having the pattern of the first opening, the second opening, the third opening, and the fourth opening.

10. The method for manufacturing a semiconductor structure as claimed in claim 9, wherein the first conductive structure and the second conductive structure have rounded sidewalls while the third conductive structure and the fourth conductive structure have flat sidewalls.

11. The method for manufacturing a semiconductor structure as claimed in claim 9, wherein the first conductive structure and the second conductive structure are aligned in a first line, and the third conductive structure and the fourth conductive structure are aligned in a second line substantially parallel with the first line.

12. The method for manufacturing a semiconductor structure as claimed in claim 9, wherein the first opening and the third opening are separated by the first spacer and the second opening and the fourth opening are separated by the second spacer.

13. The method for manufacturing a semiconductor structure as claimed in claim 9, further comprising:
   forming a fifth opening in the material layer when the first opening and the second opening are formed;
   forming a third spacer on sidewalls of the fifth opening when the first spacer and the second spacer are formed;
   patterning the mask layer and the dielectric layer according to a pattern of the fifth opening; and
   forming a fifth conductive structure in the dielectric layer having the pattern of the fifth opening.

14. The method for manufacturing a semiconductor structure as claimed in claim 13, further comprising:
   forming a sixth opening in the material layer when the third opening and the fourth opening are formed;
   patterning the mask layer and the dielectric layer according to a pattern of the sixth opening; and
   forming a sixth conductive structure in the dielectric layer having the pattern of the sixth opening.

15. The method for manufacturing a semiconductor structure as claimed in claim 14, wherein the first conductive structure and the second conductive structure are aligned in a first line, and the fifth conductive structure and the sixth conductive structure are aligned in a second line substantially parallel with the first line.

16. A method for forming a semiconductor structure, comprising:
   forming a mask layer over dielectric layer over a substrate;
   forming a material layer over the mask layer;
   forming a first blocking structure, a second blocking structure, and a third blocking structure in the material layer isolated from one another by the material layer;
   forming a first opening and a second opening in the material layer aligned with the first blocking structure;
   forming a first spacer on sidewalls of the first opening and a second spacer on sidewalls of the second opening;
   forming a third opening, a fourth opening, and a fifth opening in the material layer aligned with the second blocking structure and the third blocking structure after the first spacer is formed;
   patterning the mask layer and the dielectric layer according to a pattern of the first opening, the second opening, the third opening, the fourth opening, and the fifth opening; and
   forming a first conductive structure, a second conductive structure, a third conductive structure, a fourth conductive structure, and a fifth conductive structure in the dielectric layer having the pattern of the first opening, the second opening, the third opening, the fourth opening, and the fifth opening.

17. The method for manufacturing a semiconductor structure as claimed in claim 16, wherein the first conductive structure and the second conductive structure are aligned in a first line, and the third conductive structure, the fourth conductive structure, and the fifth conductive structure are aligned in a second line substantially parallel with the first line.

18. The method for manufacturing a semiconductor structure as claimed in claim 16, wherein the first opening and the third opening are separated by the first spacer and the second opening and the fourth opening are separated by the second spacer.

19. The method for manufacturing a semiconductor structure as claimed in claim 16, wherein the first spacer is in contact with the second blocking structure, and the second spacer is in contact with the third blocking structure.

20. The method for manufacturing a semiconductor structure as claimed in claim 16, wherein the first opening and the second opening are separated by the first blocking structure, and the third opening and the fourth opening are separated by the second blocking structure.

* * * * *